(12) United States Patent
Din et al.

(10) Patent No.: US 9,344,039 B2
(45) Date of Patent: May 17, 2016

(54) DOWN-CONVERSION CIRCUIT WITH INTERFERENCE DETECTION

(71) Applicant: Telefonaktiebolaget L M Ericsson (publ), Stockholm (SE)

(72) Inventors: Imad Ud Din, Lund (SE); Stefan Andersson, Lund (SE); Henrik Sjoland, Lund (SE); Fredrik Tillman, Lund (SE); Johan Wernehag, Malmo (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 14/375,788

(22) PCT Filed: Jan. 23, 2013

(86) PCT No.: PCT/EP2013/051254
§ 371 (c)(1),
(2) Date: Jul. 30, 2014

(87) PCT Pub. No.: WO2013/113599
PCT Pub. Date: Aug. 8, 2013

(65) Prior Publication Data
US 2014/0370833 A1  Dec. 18, 2014

Related U.S. Application Data

(60) Provisional application No. 61/596,311, filed on Feb. 8, 2012.

(30) Foreign Application Priority Data

Feb. 3, 2012  (EP) ..................................... 12153827

(51) Int. Cl.
*H04B 1/10*  (2006.01)
*H03D 7/14*  (2006.01)
*H04B 1/28*  (2006.01)
*H03G 3/30*  (2006.01)
*H04B 1/16*  (2006.01)

(52) U.S. Cl.
CPC ........... *H03D 7/1466* (2013.01); *H03D 7/1441* (2013.01); *H03D 7/1458* (2013.01); *H03G3/3036* (2013.01); *H04B 1/109* (2013.01); *H04B 1/1027* (2013.01); *H04B 1/16* (2013.01); *H04B 1/28* (2013.01); *H03D 2200/0088* (2013.01)

(58) Field of Classification Search
CPC .. H03D 7/18; H03D 7/165; H03D 2200/0086
USPC .......... 455/295, 296, 302, 310, 315, 318, 334
See application file for complete search history.

(56) References Cited

U.S. PATENT DOCUMENTS

| | | | |
|---|---|---|---|
| 6,870,571 B1 | 3/2005 | Narushima et al. | |
| 7,483,683 B1 | 1/2009 | Wong et al. | |
| 8,422,975 B2 * | 4/2013 | Behera et al. | 455/296 |
| 8,525,573 B2 | 9/2013 | Cicalini | |
| 8,977,211 B1 * | 3/2015 | Tinella et al. | 455/67.11 |
| 9,071,197 B2 * | 6/2015 | Vora et al. | 1/1 |
| 2004/0142673 A1 | 7/2004 | Asayama Sanae et al. | |
| 2005/0239430 A1 | 10/2005 | Shah | |
| 2007/0268961 A1 | 11/2007 | Lin | |
| 2008/0076375 A1 | 3/2008 | Cooley et al. | |
| 2010/0120377 A1 | 5/2010 | He | |
| 2010/0253412 A1 | 10/2010 | Brekelmans et al. | |
| 2010/0267354 A1 | 10/2010 | Mirzaei et al. | |
| 2010/0283526 A1 | 11/2010 | Van Sinderen et al. | |
| 2010/0317308 A1 | 12/2010 | Mirzaei et al. | |
| 2010/0321590 A1 | 12/2010 | Satoda et al. | |
| 2011/0006849 A1 | 1/2011 | Lee et al. | |
| 2011/0217945 A1 | 9/2011 | Uehara et al. | |
| 2011/0300885 A1 | 12/2011 | Darabi et al. | |
| 2012/0313672 A1 * | 12/2012 | Andersson et al. | 327/116 |
| 2013/0293303 A1 | 11/2013 | Uehara et al. | |
| 2014/0378077 A1 * | 12/2014 | Din et al. | 455/197.3 |

FOREIGN PATENT DOCUMENTS

| | | |
|---|---|---|
| EP | 1 630 950 A1 | 3/2006 |
| EP | 2 360 835 A1 | 8/2011 |
| WO | 0145279 A1 | 6/2001 |
| WO | 2005/091493 A1 | 9/2005 |

| | | | |
|---|---|---|---|
| WO | 2008/139390 | A1 | 11/2008 |
| WO | 2010/107460 | A1 | 9/2010 |
| WO | 2011101305 | A1 | 8/2011 |

OTHER PUBLICATIONS

PCT International Search Report, mailed Apr. 22, 2013, in connection with International Application No. PCT/EP2013/051254, all pages.

Bagheri, Rahim et al. "An 800-MHz-6-GHz Software-Defined Wireless Receiver in 90-nm CMOS" IEEE Journal of Solid-State Circuits, vol. 41, No. 12, Dec. 2006, pp. 2860-2876.

Ru, Z. et al. "A Software-Defined Radio Receiver Architecture Robust to Out-of-Band Interference", 2009 IEEE International Solid-State Circuits Conference, Session 12, RF Building Blocks/12.8, pp. 229-231; 978-1-4244-3457-2/09.

Moseley, Niels et al. "A 400-to-900 MHz Receiver with Dual-domain Harmonic Rejection Exploiting Adaptive Interference Cancellation", 2009 IEEE International Solid-State Circuits Conference, Session 12, RF Building Blocks/12.9, pp. 231-233; 978-1-4244-3457-2/09.

Extended European Search Report, mailed Jul. 16, 2012, in connection with European Patent Application No. 12 15 3827, all pages.

Moseley, N.A. et al. "A Two-Stage Approach to Harmonic Rejection Mixing Using Blind Interference Cancellation" IEEE Transactions on Circuits and Systems II: Express Briefs, IEEE, US, vol. 55, No. 10, Oct. 1, 2008, pp. 966-970; XP011236580, ISSN: 1549-7747.

PCT International Search Report, mailed Apr. 25, 2013, in connection with International Application No. PCT/EP2013/051248, all pages.

Extended European Search Report, dated Jul. 16, 2012, in connection with European Patent Application No. 12153826.8-1246, all pages.

Article EP 94(3) Communication, dated Mar. 3, 2014, in connection with European Patent Application No. 12153826.8-1855, all pages.

Blaakmeer, S.C. et al. "Wideband balun-LNA with simultaneous output balancing, noise canceling and distortion canceling" IEEE Journal of Solid-State Circuits, vol. 43, No. 6, Jun. 2008, pp. 1341-1350.

EP 94(3) Communication, dated Nov. 13, 2014, in connection with counterpart European Patent Application No. 12 153 826.8-1855, all pages.

Bruccoleri, Federico et al., "Wide-Band CMOS Low-Noise Amplifier Exploiting Thermal Noise Canceling", IEEE Journal of Solid-State Circuits, Vol. 39, No. 2, Feb. 2004, 8 pages.

Office Action issued May 5, 2015 in connection with U.S. Appl. No. 14/376,085, 22 pages.

Office Action issued Oct. 22, 2015 in connection with U.S. Appl. No. 14/376,085, 19 pages.

* cited by examiner

*Primary Examiner* — Duc M Nguyen

(74) *Attorney, Agent, or Firm* — Leffler Intellectual Property Law, PLLC

(57) ABSTRACT

A down-conversion circuit for a receiver circuit is disclosed. It comprises a first mixer arranged to down-convert an RF signal with a first LO signal (LO1), thereby generating a first down-converted signal. It further comprises a second mixer arranged to down-convert the RF signal with a second LO signal (LO2) having the same LO frequency as the first LO signal (LO1), but a different and a second duty cycle, thereby generating a second down-converted signal. The second mixer has an enabled and a disabled mode. The down-conversion circuit also comprises a third mixer arranged to down-convert the RF signal with the second LO signal (LO2), thereby generating a third down-converted signal. A passive output combiner network is used to combine the first and the second down-converted signals such that harmonically down-converted signal content present in the first down-converted signal and harmonically down-converted signal content present in the second down-converted signal cancel in a combined output signal of the down-conversion circuit. The down-conversion circuit further comprises a detection unit adapted to detect interference based on the first and third down-converted signals and to selectively set the second passive switching mixer in the enabled mode, for counteracting the interference, or in the disabled mode, for saving power compared with the enabled mode, based on the detection. A corresponding receiver circuit, a corresponding communication device, and a corresponding method are also disclosed.

16 Claims, 4 Drawing Sheets

DOWN-CONVERSION CIRCUIT WITH INTERFERENCE DETECTION

CROSS-REFERENCE TO RELATED APPLICATIONS

This application claims priority under 35 U.S.C. §119 to European Patent Application No. 12153827.6, filed Feb. 3, 2012, which is hereby incorporated herein by reference in its entirety. This application also claims the benefit of U.S. Provisional Application No. 61/596,311, filed Feb. 8, 2012, which is hereby incorporated herein by reference in its entirety.

TECHNICAL FIELD

The present invention relates to a down-conversion circuit for a receiver circuit capable of detecting and suppressing interference.

BACKGROUND

Due to the deployment of more and more frequency bands for radio-communications applications, the complexity of radio front-end circuitry to be used in such applications increases. Normally, at least one relatively expensive external (or "off-chip") filter, usually a SAW (Surface Acoustic Wave) filter and/or duplexer, has to be used for each frequency band to be received with the cellular radio. Therefore the size and cost of the external front-end components increase when introducing new frequency bands. Striving towards more flexible front-end solutions requires new circuit solutions that can handle strong interferers and prevent harmonic down-conversion without sacrificing any other performance.

It is thus desirable to provide radio front-end circuitry that eliminates the need for at least some of the off-chip filters, e.g. relatively expensive SAW filters and/or duplexers, that are normally used in present cellular radio communications circuitry, or that at least relaxes the requirements on such off-chip filters, which in turn facilitates a reduction of manufacturing cost.

To handle the strong out-of-band interference in cell phones, or other similar communication devices, without using sharp radio frequency (RF) filters, such as SAW filters and/or duplexer, a relatively high linearity is normally needed. Otherwise the unfiltered amplified interference might saturate low-noise amplifiers (LNAs) or down-conversion mixers. To reduce the interference, it has been proposed (e.g. in US 2005/0239430 A1) to use so called harmonic rejection in down-conversion circuitry to suppress interference at harmonics of a local oscillator (LO) signal, which is particularly useful in a radio receiver without sharp RF filters, since interferers at harmonics of the LO signal will be down-converted to baseband and, unless suppressed in some way, detrimentally interfere with the (desired) baseband signal.

SUMMARY

The inventors have realized that many existing solutions (e.g. US 2005/0239430 A1) that attempt to reduce harmonic down conversion mainly do so by relying on active buffers in the mixer and are not very energy efficient. An object of the present invention is therefore to provide a down-conversion circuit with suppression of interference in a relatively energy-efficient manner.

According to a first aspect, there is provided a down-conversion circuit for a receiver circuit, such as a radio receiver circuit or a wireline receiver circuit. The down-conversion circuit comprises a first passive switching mixer arranged to down-convert a received radio frequency (RF) signal with a first local oscillator (LO) signal having a first duty cycle for generating a first down-converted signal at an output port of the first passive switching mixer. The down-conversion circuit further comprises a second passive switching mixer arranged to down-convert the received RF signal with a second LO signal having the same LO frequency as the first LO signal and a second duty cycle, different from the first duty cycle, for generating a second down-converted signal at an output port of the second passive switching mixer. The second passive switching mixer has an enabled and a disabled mode. Furthermore, the down-conversion circuit comprises a third passive switching mixer arranged to down-convert the received RF signal with the second LO signal for generating a third down-converted signal at an output port of the third passive switching mixer. Moreover, the down-conversion circuit comprises a passive output combiner network operatively connected to the output ports of the first passive switching mixer and the second passive switching mixer and arranged to combine the first and the second down-converted signals such that harmonically down-converted signal content present in the first down-converted signal and harmonically down-converted signal content present in the second down-converted signal cancel in a combined output signal of the down-conversion circuit. In addition, the down-conversion circuit comprises a detection unit adapted to detect interference based on the first and third down-converted signals and to selectively set the second passive switching mixer in the enabled mode, for counteracting the interference, or in the disabled mode, for saving power compared with the enabled mode, based on the detection.

The detection unit may be adapted to generate a detection signal based on the first and third down-converted signals. The detection signal may be a sum of the first and third down-converted signals when the second passive switching mixer is in the disabled mode and a difference between the first and third down-converted signals when the second passive switching mixer is in the enabled mode. The detection unit may be adapted to detect said interference based on the detection signal.

The down-conversion circuit may comprise a first automatic gain-control (AGC) circuit arranged to receive the combined output signal as an input signal. The down-conversion circuit may further comprise a second AGC circuit arranged to receive the detection signal as an input signal. The detection unit may be adapted to detect the interference based on gain-control signals of the first and the second AGC circuits.

The detection unit may be adapted to, when the second passive switching mixer is in the enabled mode, detect an absence of interference based on a relation between the gain-control signal of the first AGC circuit and the gain-control signal of the second AGC circuit and, in response to the detected absence of interference, set the second passive switching mixer in the disabled mode.

The detection unit may be adapted to, when the second passive switching mixer is in the disabled mode, detect a presence of interference based on a relation between the gain-control signal of the first AGC circuit and the gain-control signal of the second AGC circuit and, in response to the detected presence of interference, set the second passive switching mixer in the enabled mode.

Said relation between the gain-control signal of the first AGC circuit and the gain-control signal of the second AGC circuit may e.g. be a difference or a ratio.

The first duty cycle may be 25%. The second duty cycle may be 50%.

Said harmonically down-converted signal content present in the first down-converted signal and said harmonically down-converted signal content present in the second down-converted signal that cancel in the combined output signal may comprise signal content down-converted by 3rd and 5th harmonics of the first LO signal and signal content down converted by 3rd and 5th harmonics of the second LO signal, respectively.

The passive output combiner network may be tunable to adjust magnitudes and phases of the first and the second down-converted signals.

The down-conversion circuit may be arranged to perform frequency-translated filtering.

According to a second aspect, there is provided receiver circuit, such as a radio receiver circuit or a wireline receiver circuit, comprising the down-conversion circuit according to the first aspect.

According to a third aspect, there is provided a communication device comprising the radio receiver circuit according to the second aspect. The communication device may e.g. be, but is not limited to, a wireless communication device such as a mobile phone, a wireless data modem, or a radio base station, or a wireline communication device.

According to a fourth aspect, there is provided a method of controlling a down-conversion circuit for a receiver circuit, such as a radio receiver circuit or a wireline receiver circuit. The down-conversion circuit comprises a first passive switching mixer arranged to down-convert a received RF signal with a first LO signal having a first duty cycle for generating a first down-converted signal at an output port of the first passive switching mixer. The down-conversion circuit further comprises a second passive switching mixer arranged to down-convert the received RF signal with a second LO signal having the same LO frequency as the first LO signal and a second duty cycle, different from the first duty cycle, for generating a second down-converted signal at an output port of the second passive switching mixer. The second passive switching mixer has an enabled and a disabled mode. Furthermore, the down-conversion circuit comprises a third passive switching mixer arranged to down-convert the received RF signal with the second LO signal for generating a third down-converted signal at an output port of the third passive switching mixer. Moreover, the down-conversion circuit comprises a passive output combiner network operatively connected to the output ports of the first passive switching mixer and the second passive switching mixer and arranged to combine the first and the second down-converted signals such that harmonically down-converted signal content present in the first down-converted signal and harmonically down-converted signal content present in the second down-converted signal cancel in a combined output signal of the down-conversion circuit. The method comprises detecting interference based on the first and third down-converted signals. The method further comprises selectively setting the second passive switching mixer in the enabled mode, for counteracting the interference, or in the disabled mode, for saving power compared with the enabled mode, based on the detection.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
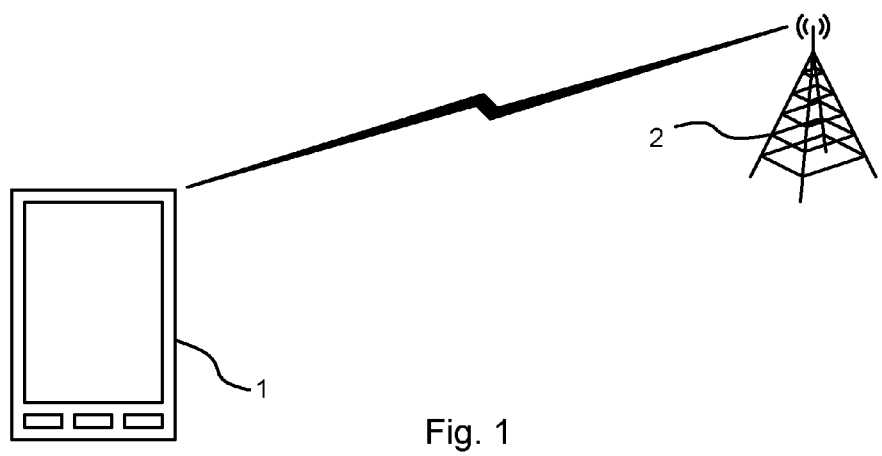
FIG. 1 schematically illustrates a mobile terminal in communication with a radio base station.

FIG. 1 illustrates schematically an environment in which embodiments of the present invention may be employed. In FIG. 1, a mobile terminal 1, illustrated in FIG. 1 as a mobile, or cellular, telephone 1, is in wireless communication with a radio base station 2, e.g. in a cellular communication network. The mobile telephone 1 and the radio base station 2 are nonlimiting examples of what is referred to below generically with the term communication device. Another nonlimiting example of such a communication device is a wireless data modem, e.g. a wireless data modem to be used in a cellular communication network. Embodiments of the present invention may also be employed in communication devices for operation in other types of communication networks, such as but not limited to wireless local area networks (WLANs) and personal area networks (PANs). The examples considered above are all wireless communication devices, but embodiments of the present invention may be employed in wireline communication devices as wells.

Figure 2:
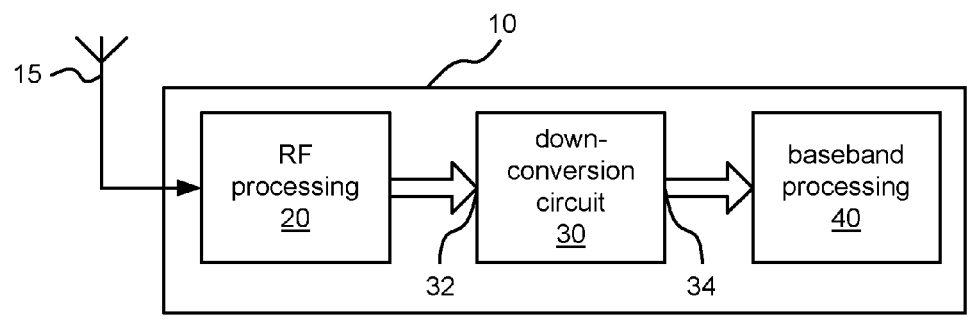
FIG. 2 is a simplified block diagram of a radio receiver circuit.

Such communication devices may comprise one or more receiver circuits. In the following, such receiver circuits are referred to in a wireless communication context as radio receiver circuits. However, as mentioned above, embodiments of the present invention are applicable in wireline communication devices as well. An example of such a radio receiver circuit is briefly described below with reference to FIG. 2. FIG. 2 is a simplified block diagram of a radio receiver circuit 10 according to an embodiment of the present invention. In FIG. 2, the radio receiver circuit 10 is connected to an antenna 15 for receiving electromagnetic radio frequency (RF) signals. Although a single antenna 15 is shown in FIG. 2, multiple antennas may well be used in other embodiments. In the embodiment illustrated in FIG. 2, the radio receiver circuit comprises RF processing circuitry 20 for operative connection to the antenna 15. The RF processing circuitry 20 is adapted to perform (analog) signal processing on RF signals from the antenna 15. The RF processing circuitry may comprise one or more filters, transformers (e.g. balun transformers), and/or other circuitry for processing of RF signals. Such circuitry is, per se, well known in the art of radio receivers and is therefore not further described herein in greater detail. (In a wireline communication device, the antenna 15 is replaced with a cable connector.)

Furthermore, the embodiment of the radio receiver circuit 10 illustrated in FIG. 2 comprises a down-conversion circuit 30 for down-conversion, frequency translation to a lower frequency, of a received RF input signal (in this particular context first processed by the RF processing circuitry 20). Such frequency translation is based on a local oscillator (LO) signal, and may be referred to as "down-converting the received RF signal with the LO signal". The down-conversion circuit 30 has an input port 32 for supplying the received RF signal to the down-conversion circuit. Furthermore, the down-conversion circuit 30 has an output port 34 for outputting a down-converted output signal.

The radio receiver circuit 10 illustrated in FIG. 2 is assumed to be a homodyne radio receiver circuit. Thus, the radio receiver circuit 2 comprises baseband processing circuitry 40 operatively connected to the output port 34 of the down-conversion circuit 30 for processing the output signal from the down-conversion circuit 30. However, embodiments of the down-conversion circuit 30 described herein are applicable in other types of radio receiver circuits as well, e.g. radio receiver circuits wherein frequency translation is performed in one or more steps to one or more (non-zero) intermediate frequencies (IFs).

The baseband processing circuitry 40 may comprise one or more filters, amplifiers, analog-to-digital converters, digital signal processors, and/or other circuitry for processing of baseband signals. Such circuitry is, per se well known in the art of radio receivers and is therefore not further described herein in greater detail.

Figure 3:
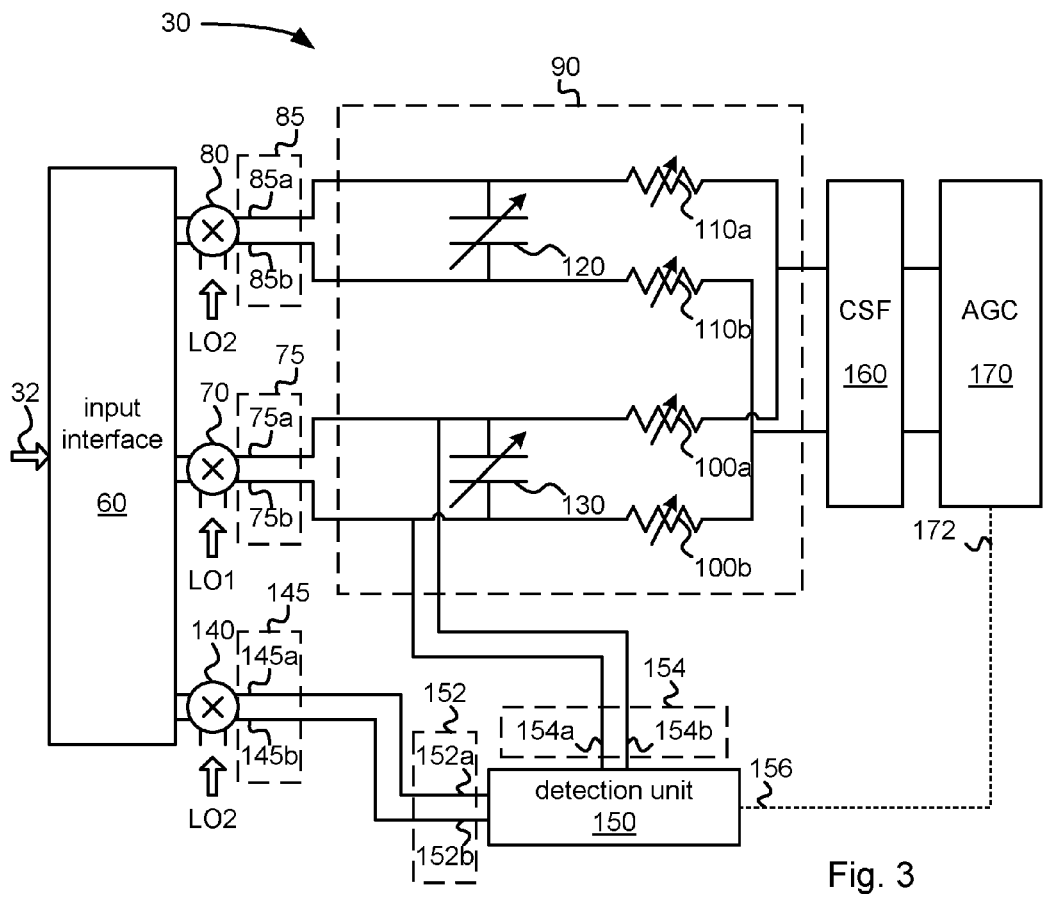
FIG. 3 schematically illustrates a down-conversion circuit according to some embodiments of the present invention.

FIG. 3 shows a simplified schematic circuit diagram of the down-conversion circuit 30 according to some embodiments of the present invention. FIG. 3 illustrates a differential down-conversion circuit 30 using differential LO signals and differential signal paths. The embodiments described in detail herein are such differential embodiments. However, single-ended implementations are also possible according to some embodiments of the present invention. In FIG. 3, the down-conversion circuit 30 comprises a first passive switching mixer 70. The first passive switching mixer 70 is arranged to down-convert the received RF signal with a first LO signal LO1 for generating a first down-converted signal at an output port 75 of the first passive switching mixer 70. The first LO signal LO1 has a frequency, in the following referred to as the LO frequency. Furthermore, the first LO signal LO1 has a first duty cycle.

Furthermore, in FIG. 3, the down-conversion circuit 30 comprises a second passive switching mixer 80. The second passive switching mixer 80 is arranged to down-convert the received RF signal with a second LO signal LO2 for generating a second down-converted signal at an output port (85) of the second passive switching mixer 80. The second LO signal LO2 has the same LO frequency as the first LO signal LO1. Furthermore, the second LO signal LO2 has a second duty cycle, different from the first duty cycle.

As illustrated in FIG. 3, the down-conversion circuit 30 may comprise an interface circuit 60 arranged to distribute the received RF signal to the first and the second passive switching mixers 70 and 80. Such an input interface circuit 60 may e.g. comprise one or more low-noise amplifiers (LNAs).

Moreover, In FIG. 3, the down-conversion circuit 30 comprises a passive output combiner network 90 operatively connected to the output ports 75, 85 of the first passive switching mixer 70 and the second passive switching mixer 80. The passive output combiner network 90 is arranged to combine the first and the second down-converted signals such that harmonically down-converted signal content present in the first down-converted signal and harmonically down-converted signal content present in the second down-converted signal cancel in a combined output signal of the down-conversion circuit 30.

In FIG. 3, the down-conversion circuit 30 comprises a third passive switching mixer 140. The third passive switching mixer is arranged to down-convert the received RF signal with the second LO signal LO2 for generating a third down-converted signal at an output port 145 of the third passive switching mixer 140. The down-conversion circuit 30 further comprises a detection unit 150 arranged to receive the first and the third down-converted signals at input ports 154 and 152, respectively, of the detection unit 150. The detection unit 150 is further described below in the context of various embodiments.

Furthermore, as illustrated in FIG. 3, the down-conversion circuit 30 may comprise a channel-selection filter (CSF 160) operatively connected to the passive output combiner network 90 for filtering the combined output signal. Moreover, as illustrated in FIG. 3, the down-conversion circuit 30 may comprise a first automatic gain-control (AGC) circuit 170 arranged to receive the combined output signal (in FIG. 3, via the CSF 160) as an input signal. The combined output signal may be output on the output port 34 of the down-conversion circuit. Alternatively, it may e.g. be the output of the CSF 160 or the first AGC circuit 170 that is output on the output port 34 of the down-conversion circuit 30.

In FIG. 3, a particular implementation of the passive output combiner network 90 comprising resistors 100a-b, 110a-b and capacitors 120, 130 is shown. Before going into such details of a particular implementation, some more general principles of the harmonic rejection provided by embodiments of the down-conversion circuit 30 are first described. In the following, reference is sometimes made to sums and differences between signals in the analog domain. These terms should be interpreted as including weighted sums and differences, i.e. where the terms may be weighted, or scaled, before addition or subtraction.

Figure 4:
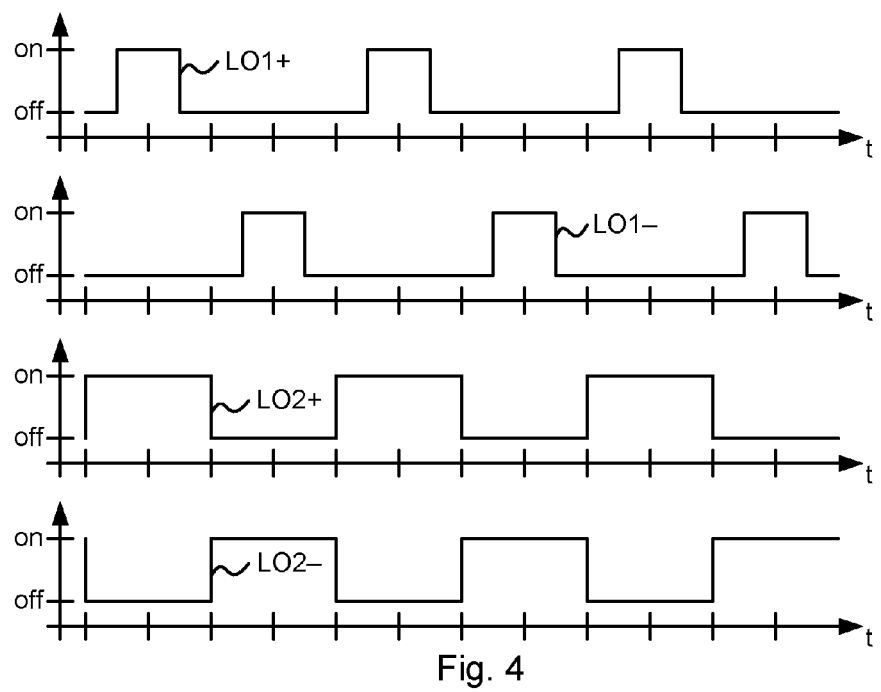
FIG. 4 show waveform diagrams of LO signals according to an example.

According to some embodiments of the present invention, which are used throughout this detailed description as an elucidating example, the first duty cycle is 25% and the second duty cycle is 50%. This is illustrated in FIG. 4, which schematically illustrates waveform diagrams of the LO signals LO1 and LO2 with these duty cycles. Since differential LO signals are considered, LO1 has a positive signal component LO1+ and a negative signal component LO1−. Similarly, LO2 has a positive signal component LO2+ and a negative signal component LO2−. Since switching mixers (70 and 80 in FIG. 3) are used, the LO signal waveforms are square waves. Therefore, the mixers 70 and 80 will not only down-convert signal content with the fundamental tones of the respective LO signals LO1 and LO2, but also with harmonics of the LO signals LO1 and LO2, referred to above and in the following as harmonically down-converted signal content. Unless compensated for, such harmonically down-converted signal content will interfere with the desired signal content (i.e. the signal content down-converted with the fundamental tone of an LO signal). Using a differential topology (e.g. as in FIG. 3) inherently suppresses signal content down-converted by even-order harmonics. However, it does not take care of signal content down-converted by odd-order harmonics.

Using a Fourier-series expansion of square-wave signals with amplitude A, angular frequency ω, and a duty-cycle of k/T, it can be shown that the 3rd harmonic is given by $$\frac{2A}{\pi}\frac{1}{3}\sin\left(3\pi\frac{k}{T}\right)\cos(3\omega t) \qquad \text{(Eq. 1)}$$

where t denotes time. Similarly, the 5th harmonic is given by $$\frac{2A}{\pi}\frac{1}{5}\sin\left(5\pi\frac{k}{T}\right)\cos(5\omega t) \qquad \text{(Eq. 2)}$$

Inserting 0.25 for k/T in Eq. 1 and Eq. 2 provides the 3rd and 5th harmonics, respectively, for the 25% duty-cycle square wave, in the following denoted $h_{25}^3(t)$ and $h_{25}^5(t)$, respectively. Similarly, inserting 0.5 for k/T in Eq. 1 and Eq. 2 provides the 3rd and 5th harmonics, respectively, for the 50% duty-cycle square wave, in the following denoted $h_{50}^3(t)$ and $h_{50}^5(t)$, respectively. It can be shown that $$h_{25}^3(t) = -\sqrt{2}h_{50}^3(t) \qquad \text{(Eq. 3)}$$

and $$h_{25}^5(t) = -\sqrt{2}h_{50}^5(t) \qquad \text{(Eq. 4)}$$

Hence, there is the same weight-deviation between the 3rd harmonics of the 50% and 25% duty-cycle square-wave signals as there is between the 5th harmonics of the 50% and 25% duty-cycle square-wave signals. Thus, by properly weighting the output currents from the mixers 70 and 80, harmonically down-converted signal content down-converted by both the 3rd and the 5th harmonics of the first and second LO signals LO1 and LO2 will cancel in the combined output signal. At the same time, it can be noted that signal content down-converted by the fundamental tones of the first and second LO signals LO1 and LO2 will under these circumstances combine constructively.

Accordingly, in accordance with some embodiments of the present invention, said harmonically down-converted signal content present in the first down-converted signal and said harmonically down-converted signal content present in the second down-converted signal that cancel in the combined output signal comprises signal content down-converted by 3rd and 5th harmonics of the first LO signal LO1 and signal content down converted by 3rd and 5th harmonics of the second LO signal LO2, respectively.

It should be noted that, in practice, it is not possible to generate LO signals with exactly 25% and 50% duty cycle; the duty cycles will deviate from these values e.g. due to manufacturing inaccuracies, temperature variations, noise, etc. Thus, the numbers 25% and 50% should not be interpreted as exactly 25% and 50%. Deviations from these exact numbers (or other intended duty cycles) may be compensated for using tuning of the passive output combiner network.

Selecting other combinations of duty cycles than 25% and 50% may provide for cancellation of other harmonics or combination of harmonics. However, the 3rd and 5th harmonics are normally the most important ones to cancel, since the amplitude of the harmonics decrease with increasing order. In some embodiments, the duty cycle of the second LO signal LO2 may be selected as (approximately) twice the duty cycle of the first LO signal LO1. Such a relation between the duty cycles provides for a relatively easy generation of the LO signals LO1 and LO2.

Figure 5:
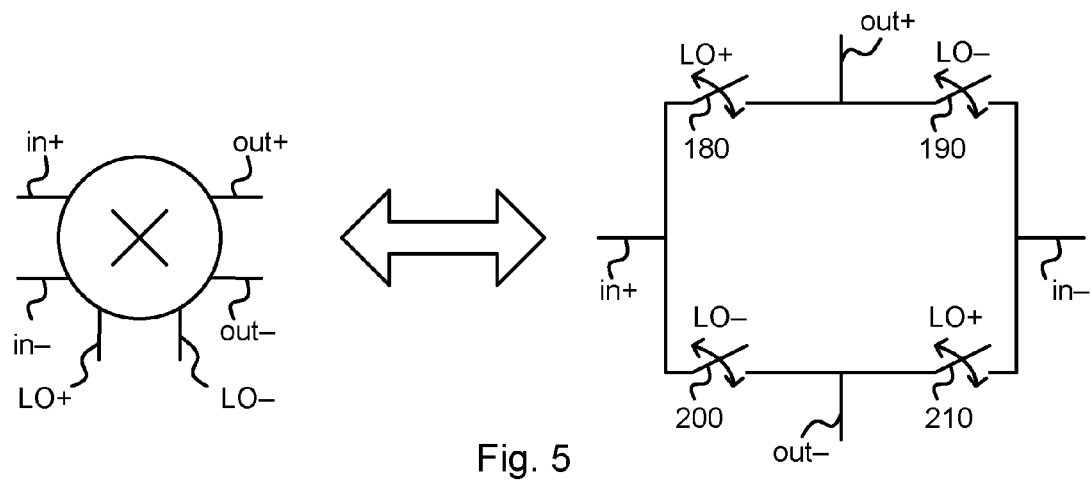
FIG. 5 schematically illustrates implementation of a passive switching mixer.

FIG. 5 illustrates an implementation of a passive switching mixer according to embodiments of the present invention, which may be used for implementation of the first, second, and third passive mixers 70, 80, and 140 in the down-conversion circuit 30. In passive switching mixers, a switch is used to either connect an input terminal to an output terminal in a closed state, or disconnect the input terminal from the output terminal in an open state, in response to an LO signal (such as the first LO signal LO1 or the second LO signal LO2). The passive switching mixer in FIG. 5 has a differential input port with input terminals in+ and in−, and a differential output port with output terminals out+ and out−. Furthermore, a differential LO signal having signal components LO+ (e.g. LO1+ or LO2+) and LO− (e.g. LO1− or LO2−) is used to control the switches in the passive switching mixer. Such a passive switching mixer is normally referred to as a double-balanced passive mixer. In FIG. 5, the passive switching mixer comprises a switch 180 connected between in+ and out+, a switch 190 connected between in− and out+, a switch 200 connected between in+ and out−, and a switch 210 connected between in− and out−. The switches 180 and 210 are controlled with LO+, and the switches 190 and 200 are controlled with LO−. Comparing with FIG. 4, the state 'on' means that a corresponding switch is closed, and the state 'off' means that a corresponding switch is open. The switches in a passive switching mixer may be implemented with transistors, such as MOS transistors.

The use of passive switching mixers together with a passive output combiner network provides for a dual functionality for interference suppression. In addition to the harmonic rejection described above, the down-conversion circuit may additionally be arranged to provide frequency-translated filtering. For example, the passive output combiner network may have a low-pass characteristic as seen from the output ports of the passive switching mixers 70 and 80. Seen from the input ports of the passive switching mixers, the low-pass characteristic is transformed to a band-pass characteristic, which provides for a further suppression of interference. Frequency translated filtering is known as such, see e.g. US 2010/0267354. However, frequency-translated filters are normally used as separate components. Using embodiments of the present invention, the frequency translated filtering is built in into the down-conversion circuit 30 that performs the harmonic rejection, which is beneficial for saving power and/or circuit area, since no additional dedicated circuitry is required for the frequency translated-filtering.

According to some embodiments of the present invention, the passive output combiner network 90 is tunable to adjust magnitudes and phases of the first and the second down-converted signals. Using a tunable network of passive component provides for combining the first and second down-converted signals such that the harmonically down-converted signal content cancel with relatively high accuracy in the combined output signal, e.g. compared with known techniques that attempt to reduce harmonic down conversion by relying on active buffers with weighted amplitudes. In particular, even though such known techniques may use control of the amplitude weights of the active buffers, it is difficult (or even neglected) to control the phases of signals to be combined for canceling harmonically down-converted signal content, which may limit the effectiveness of the cancellation. The inventors have realized that such phase control can be made more effectively using a tunable passive combiner network. Furthermore, known techniques relying on active buffers in the signal paths for controlling the cancellation normally requires more than two signal paths whose respective output signals are combined, whereas embodiments of the present invention can provide for relatively accurate cancellation of harmonically down-converted signal content using only two signal paths (although the scope of the invention is not intended to exclude embodiments where additional signal paths with other duty cycle are present as well).

An example of such a tunable passive network used for the passive output combiner network is illustrated in FIG. 3. Since a differential topology is considered, the first and the second down-converted signals are differential signals. Furthermore, the output port 75 of the first passive switching mixer 70 and the output port 85 of the second passive switching mixer 80 are both differential output ports, each having a first and a second output terminal 75a-b, 85a-b. Similarly, the third down-converted signal is also a differential signal. The output port 145 of the third passive switching mixer 140 is also a differential output port, having a first and a second output terminal 145a-b. The input ports 152 and 154 of the detection unit 150 are also differential input ports, each having a first and a second input terminal 152a-b, 154a-b.

In FIG. 3, the passive output combiner network 90 comprises a first resistor 100a, a second resistor 110a, a third resistor 100b, and a fourth resistor 110b. The first resistor 100a is operatively connected between the first output terminal 75a of the output port 75 of the first passive switching mixer 70 and a first summing node (in this case, the output terminal 34a of the down-conversion circuit 30). The second resistor 110a is operatively connected between the first output terminal 85a of the output port 85 of the second passive switching mixer 80 and the first summing node 34a. The first and second resistor act as voltage-to-current (V/I) converters and their respective currents are combined (or summed) in the first summing node. The weights of the currents are determined by the resistance values of the first and second resistors 100a and 110a.

Similarly, the third resistor 100b is operatively connected between the second output terminal 75b of the output port 75 of the first passive switching mixer 70 and a second summing node (in this case the output terminal 34b of the down-conversion circuit 30). The fourth resistor 110b is operatively connected between the second output terminal 85b of the output port 85 of the second passive switching mixer 80 and the second summing node. The third and fourth resistor also act as V/I converters and their respective currents are combined (or summed) in the second summing node. The weights of the currents are determined by the resistance values of the third and fourth resistors 100a and 110a.

Furthermore, in FIG. 3, the passive output combiner network 90 comprises capacitors 120 and 130 connected to the first and second output terminals 75a-b, 85a-b of the output ports 75, 85 of the first and the second passive switching mixers 70, 80. In FIG. 3, the capacitor 120 is shown as a differential capacitor connected between the output terminals 85a and 85b of the output port 85 of the second passive switching mixer 80, and the capacitor 130 is shown as a differential capacitor connected between the output terminals 75a and 75b of the output port 75 of the first passive switching mixer 70. However, capacitors may be connected in other ways to the output terminals 75a-b and 85a-b. For example, alternatively or additionally, capacitors may be connected between one or more of the output terminals 75a-b, 85a-b and a reference-voltage node such as ground. The phases of the first and second down-converted signals are affected by the capacitance values of the capacitors (such as 120 and 130 in FIG. 3) connected to connected to the first and second output terminals 75a-b, 85a-b of the output ports 75, 85 of the first and the second passive switching mixers 70, 80. This topology of the passive output combiner network has a low-pass characteristic. Qualitatively speaking, low-frequency currents are directed via the resistors 100a-b, 110a-b to the summing nodes, whereas high-frequency currents are directed via the capacitors. As mentioned above, this low-pass characteristic is transformed to a band-pass characteristic at the input ports of the mixers 70 and 80, thereby providing frequency-translated filtering.

According to some embodiments, the aforementioned resistors (100a-b, 110a-b in FIG. 3) and capacitors (120-130 in FIG. 3) are tunable components, as indicated by arrows over these components in FIG. 3. For example, they may be digitally-controllable components, such that their respective resistance values or capacitance values are controllable with a digital control word. Thereby, the magnitudes and phases of the first and the second down-converted signals can be adjusted, which in turn facilitates a relatively accurate cancellation of harmonically down-converted signal content in the combined output signal.

According to embodiments, the second passive switching mixer 80 may be disabled when the interference present at harmonics of the LO frequency is low, thereby saving energy. For example, the second LO signal LO2 may be set to "zero", i.e. in a state where all switches of the second passive switching mixer are open. Then, there is no charging or discharging of the gates of the transistors in the switches, whereby power is saved. Furthermore, it is possible to disable other circuitry in connection with the second passive mixer, e.g. circuitry in the input interface 60, thereby saving further energy.

Thus, according to embodiments of the present invention, the second passive switching mixer 80 has an enabled and a disabled mode. The down-conversion circuit 30 may e.g. be arranged to selectively set the second passive switching mixer 80 in the enabled mode when an interference level exceeds a threshold for counteracting the interference, and, otherwise, in the disabled mode for saving power compared with the enabled mode. For this purpose, the detection unit 150 is adapted to detect interference based on the first and third down-converted signals and to selectively set the second passive switching mixer 80 in the enabled mode, for counteracting the interference, or in the disabled mode, for saving power compared with the enabled mode, based on the detection.

Figure 6:
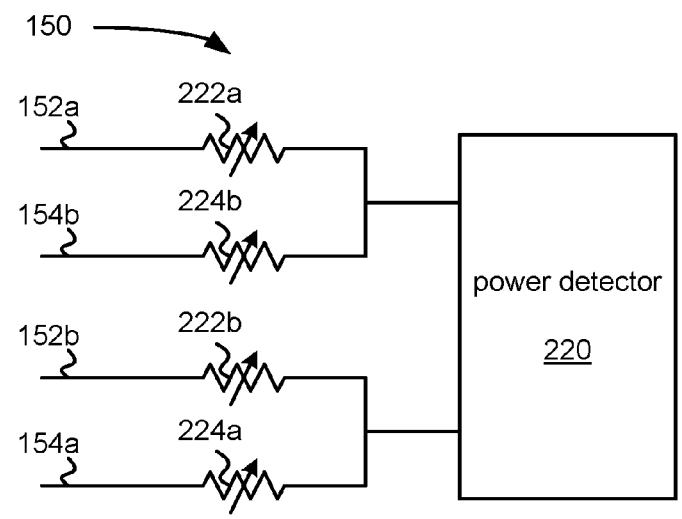
FIGS. 6-7 schematically illustrates embodiments of a detection unit.

According to some embodiments, the detection unit 150 is configured to combine the first and the third down-converted signals, thereby generating a detection signal, such that harmonically down-converted signal content present in the first down-converted signal and harmonically down-converted signal content present in the third down-converted signal combine constructively in the detection signal, whereas signal content present in the first down-converted signal and the third down-converted signal, down-converted by the fundamental of the first and the second LO signal LO1, LO2, respectively, cancel in the detection signal for detecting when said interference level exceeds said threshold. This is illustrated with an example embodiment of the detection unit 150 in FIG. 6. A positive signal component of the third down-converted signal, represented with a current input at terminal 152a, is combined with a negative signal component of the first down-converted signal, represented with a current input at terminal 154b. Similarly, a negative signal component of the third down-converted signal, represented with a current input at terminal 152b, is combined with a positive signal component of the first down-converted signal, represented with a current input at terminal 154a. Thereby, a differential signal (which corresponds to the above-mentioned detection signal) is formed that represents a difference between the first and the third down-converted (differential) signals. This difference is input to a power detector 220, which is arranged to determine the power of the interference, and based on the determined power, further determine whether the second passive switching mixer 80 should be set in the enabled or the disabled mode. As shown in FIG. 6, the detection unit may comprise resistors 222*a-b* and 224*a-b* acting as V/I converters for generating the currents based on voltages at the terminals 152*a-b* and 154*a-b*. Furthermore, as indicated in FIG. 6, these resistors may be variable for adjusting the weights of said currents.

According to some embodiments, the detection unit 150 is instead adapted to generate the detection signal based on the first and third down-converted signals differently depending on the present mode of the second passive switching mixer 80. For example, the detection unit 150 may be adapted to generate the detection signal as a sum of the first and third down-converted signals when the second passive switching mixer 80 is in the disabled mode, and as a difference between the first and third down-converted signals when the second passive switching mixer 80 is in the enabled mode. The detection unit 150 may then detect said interference based on the detection signal. For example, the detection unit 150 may be adapted to detect the interference based on a comparison between the detection signal and the combined output signal.

Figure 7:
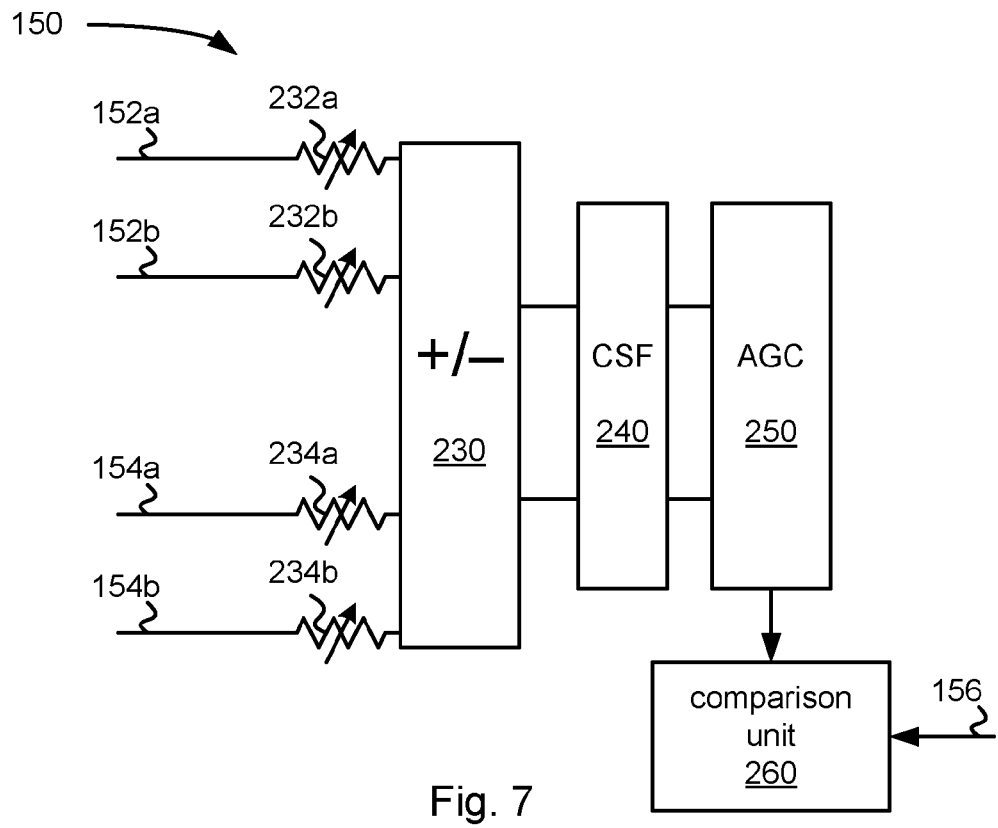

According to some such embodiments, the down-conversion circuit comprises a first AGC circuit (e.g. the AGC circuit 170 in FIG. 3) arranged to receive the combined output signal as an input signal, and a second AGC circuit arranged to receive the detection signal as an input signal. The detection unit 150 can then be adapted to detect the interference based on gain-control signals of the first and the second AGC circuits. FIG. 7 schematically illustrates such an embodiment of the detection unit 150. FIG. 7 includes a summation block 230 adapted to generate the detection signal as a sum or a difference between the first and third down-converted signals, depending on the mode of the second passive switching mixer 80. As shown in FIG. 7, the detection unit may comprise resistors 232*a*, 232*b*, 234*a*, 234*b* connected between the input terminals 152*a*, 152*b*, 154*a*, and 154*b*, respectively, and the summation block 230. In practice, ends of the resistors 152*a-b* and 154*a-b* may be hardwired together (much like the resistors 222*a-b* and 224*a-b* in FIG. 6) in the summation block 230. For example, ends of the resistors 222*a* and 224*a* may be hardwired together for forming a first signal component of the (differential) detection signal. Similarly, ends of the resistors 222*b* and 224*b* may be hardwired together for forming a second signal component of the (differential) detection signal. Whether an addition or subtraction is performed by the summation block 230 can then be controlled by controlling a phase of the LO signal of the third passive switching mixer 140. For example, addition can be achieved by controlling the third passive switching mixer with the second LO signal LO2 directly, and subtraction can be achieved by controlling the third passive switching mixer 140 with a 180 degrees phase shifted version of the second LO signal LO2.

As shown in FIG. 7, the detection unit 150 may comprises a CSF 240 for filtering the detection signal. FIG. 7 also includes the above-mentioned second AGC circuit (labeled 250 in FIG. 7) arranged to receive the detection signal as an input signal (in this particular case via the CSF 240). In FIG. 7, the detection unit 150 comprises a comparison unit 260 adapted to receive the gain-control signal of the second AGC 250 and to receive the gain-control signal of the first AGC 170 (via an output 172 of the first AGC 170 and an input 156 of the detection unit 150, see FIG. 3).

For example, the detection unit 150 may be adapted to, when the second passive switching mixer 80 is in the enabled mode, detect an absence of interference based on a relation between the gain-control signal of the first AGC circuit 170 and the gain-control signal of the second AGC circuit 250 and, in response to the detected absence of interference, set the second passive switching mixer 80 in the disabled mode. Similarly, the detection unit may be adapted to, when the second passive switching mixer is in the disabled mode, detect a presence of interference based on a relation between the gain-control signal of the first AGC circuit 170 and the gain-control signal of the second AGC circuit 250 and, in response to the detected presence of interference, set the second passive switching mixer 80 in the enabled mode. According to the embodiment illustrated in FIG. 7, the evaluation of said relation between the gain-control signals of the first and the second AGC circuit 170, 250 can be performed by the comparison unit 260.

Consider first the case when the second passive switching mixer 80 is in the disabled mode. When a large harmonic interferer appears, the channel power in the combined output signal will be large enough so that the first AGC circuit 170 backs off, that is, the gain-control signal of the first AGC circuit 170 is reduced to command a reduced gain of the first AGC circuit 170. However, when the second passive switching mixer is in the disabled mode, the detection unit 150 is configured to generate the detection signal such that the harmonic interferer is at least approximately canceled in the detection signal. Thus, the second AGC circuit 250 will see substantially less channel power due to the cancellation of the interferer. This means that the second AGC circuit 250 will not back off, at least not to the same extent as the first AGC circuit 170. Hence, a relation such as a ratio or difference between the gain control signal of the first AGC circuit 170 and the second AGC circuit 250 will tend to decrease when the second passive switching mixer 80 is in the disabled state and a harmonic interferer appears, whereby presence of the harmonic interferer can be detected. (It is assumed above and in the following that the gain-control signal of an AGC circuit controls the gain of the AGC circuit as an increasing function of the gain control signal, that is, an increasing gain-control signal means an increasing gain and a decreasing gain-control signal means a decreasing gain).

After the presence of the interferer is detected, the second passive switching mixer 80 goes from the disabled mode to the enabled mode. In this case, the harmonic interferer is canceled in the combined output signal, resulting in no back off in the first AGC circuit 170. Thus, the gain-control signal of the first AGC 170 is increased as a consequence of the removal of the harmonic interferer in the combined output signal, which in turn results in a reduced channel power in the combined output signal. However, the detection unit 150 now subtracts the first and third down-converted signals instead of adding them, which causes the harmonic interferer to dominate in the detection signal and causes a back off in the second AGC circuit 250. When the interferer again disappears, neither the first AGC circuit 170 nor the second AGC circuit 250 will have any back off. Thus, the gain-control signal of the second AGC 250 will then increase to increase the gain of the second AGC circuit 250, whereas the gain-control signal of the first AGC circuit 170 will not increase (at least not to the same extent as the gain control signal of the second AGC circuit 250). Hence, a relation such as a ratio or difference between the gain control signal of the first AGC circuit 170 and the second AGC circuit 250 will tend to decrease when the second passive switching mixer 80 is in the enabled state and a harmonic interferer (previously present) disappears, whereby absence of the harmonic interferer can be detected.

Thus, by studying, or comparing, the relation between the gain-control signal of the first AGC circuit 170 and the second AGC circuit 250, and thus how these signals behave compared with each other, presence or absence of interference may be detected.

It should be noted that the power of the signals input to the detection unit 150 on input ports 152 and 154 may be less, even considerable less, than the power of the signals input to the passive output combiner network 90, e.g. since the detection signal does not need to have as good signal-to-noise ratio (SNR) as the combined output signal. Thus, the overhead power consumption for the inclusion of the detection unit 150 may be considerably less than the power reduction obtainable by setting the second passive switching mixer 80 in the disabled mode.

According to some embodiments of the present invention, there is provided a method of controlling the down-conversion circuit 30. The method comprises detecting interference based on the first and third down-converted signals, e.g. by the detection unit 150 as described above in the context of embodiments of the down-conversion circuit 30. Furthermore, the method comprises selectively setting the second passive switching mixer in the enabled mode, for counteracting the interference, or in the disabled mode, for saving power compared with the enabled mode, based on the detection, e.g. by the detection unit 150 as described above in the context of embodiments of the down-conversion circuit 30.

Figure 8:
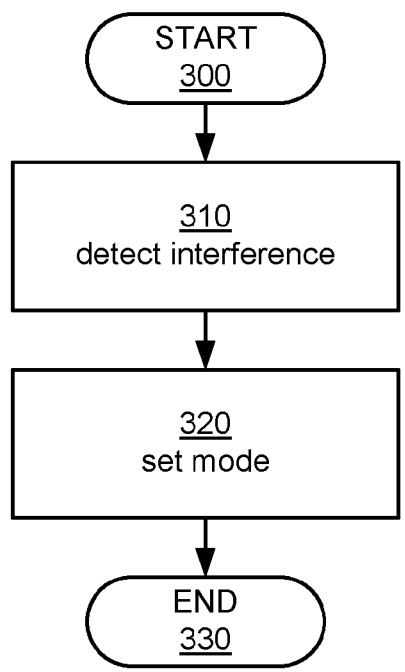
FIG. 8 is a flowchart of a method according to some embodiments of the present invention.

FIG. 8 is a flowchart for the method according to some embodiments. Execution of the method is started in step 300. In step 310, interference detection is performed. In step 320, the mode of the second passive switching mixer 80 is selectively set based on the result of the detection (e.g. presence or absence of interference). The execution of the method is ended in step 330. It should be noted that the flowchart in FIG. 8 is simplified. For example, in practice, as indicated above in the description of embodiments of the down-conversion circuit 30, the step 310 may be a more or less continually ongoing step, which may e.g. include detecting absence of interference when the second passive switching mixer 80 is in the enabled mode, and detecting presence of interference when the second passive switching mixer 80 is in the disabled mode. Step 320 may then be triggered for changing the mode of the second passive switching mixer 80 from enabled to disabled, or vice versa, when needed as indicated by the interference detection performed in step 310.

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described. The scope of the invention is only limited by the appended patent claims.

The invention claimed is:

1. A down-conversion circuit for a receiver circuit, comprising:
    a first passive switching mixer arranged to down-convert a received radio frequency (RF) signal with a first local oscillator (LO) signal having a first duty cycle for generating a first down-converted signal at an output port of the first passive switching mixer;
    a second passive switching mixer arranged to down-convert the received RF signal with a second LO signal having a same LO frequency as the first LO signal and a second duty cycle, different from the first duty cycle, for generating a second down-converted signal at an output port of the second passive switching mixer, wherein the second passive switching mixer has an enabled and a disabled mode;
    a third passive switching mixer arranged to down-convert the received RF signal with the second LO signal for generating a third down-converted signal at an output port of the third passive switching mixer;
    a passive output combiner network operatively connected to the output ports of the first passive switching mixer and the second passive switching mixer and arranged to combine the first and the second down-converted signals such that harmonically down-converted signal content present in the first down-converted signal and harmonically down-converted signal content present in the second down-converted signal cancel in a combined output signal of the down-conversion circuit; and
    a detection unit adapted to detect interference based on the first and third down-converted signals and to selectively set the second passive switching mixer in the enabled mode, for counteracting the interference, or in the disabled mode, for saving power compared with the enabled mode, based on the detection.

2. The down-conversion circuit according to claim 1, wherein the detection unit is adapted to:
    generate a detection signal based on the first and third down-converted signals, which is:
        a sum of the first and third down-converted signals when the second passive switching mixer is in the disabled mode; and
        a difference between the first and third down-converted signals when the second passive switching mixer is in the enabled mode; and
    detect said interference based on the detection signal.

3. The down-conversion circuit according to claim 2, comprising:
    a first automatic gain-control (AGC) circuit arranged to receive the combined output signal as an input signal; and
    a second AGC circuit arranged to receive the detection signal as an input signal;
    wherein:
    the detection unit is adapted to detect the interference based on gain-control signals of the first and the second AGC circuits.

4. The down-conversion circuit according to claim 3, wherein the detection unit is adapted to, when the second passive switching mixer is in the enabled mode, detect an absence of interference based on a relation between the gain-control signal of the first AGC circuit and the gain-control signal of the second AGC circuit and, in response to the detected absence of interference, set the second passive switching mixer in the disabled mode.

5. The down-conversion circuit according to claim 4, wherein said relation between the gain-control signal of the first AGC circuit and the gain-control signal of the second AGC circuit is a difference or a ratio.

6. The down-conversion circuit according to claim 3, wherein the detection unit is adapted to, when the second passive switching mixer is in the disabled mode, detect a presence of interference based on a relation between the gain-control signal of the first AGC circuit and the gain-control signal of the second AGC circuit and, in response to the detected presence of interference, set the second passive switching mixer in the enabled mode.

7. The down-conversion circuit according to claim 1, wherein the first duty cycle is 25% and the second duty cycle is 50%.

8. The down-conversion circuit according to claim 1, wherein said harmonically down-converted signal content present in the first down-converted signal and said harmonically down-converted signal content present in the second down-converted signal that cancel in the combined output signal comprises signal content down-converted by 3rd and 5th harmonics of the first LO signal and signal content down converted by 3rd and 5th harmonics of the second LO signal, respectively.

9. The down-conversion circuit according to claim 1, wherein the passive output combiner network is tunable to adjust magnitudes and phases of the first and the second down-converted signals.

10. The down-conversion circuit according to claim 1, wherein the down-conversion circuit is arranged to perform frequency-translated filtering.

11. A receiver circuit comprising the down-conversion circuit according to claim 1.

12. A communication device comprising the receiver circuit according to claim 11.

13. The wireless communication device according to claim 12, wherein the communication device is a mobile phone or a wireless data modem.

14. The communication device according to claim 12, wherein the communication device is a radio base station.

15. The communication device according to claim 12, wherein the communication device is a wireline communication device.

16. A method of controlling a down-conversion circuit for a receiver circuit, wherein the down-conversion circuit comprises:
    a first passive switching mixer arranged to down-convert a received radio frequency (RF) signal with a first local oscillator (LO) signal having a first duty cycle for generating a first down-converted signal at an output port of the first passive switching mixer;
    a second passive switching mixer arranged to down-convert the received RF signal with a second LO signal having the same LO frequency as the first LO signal and a second duty cycle, different from the first duty cycle, for generating a second down-converted signal at an output port of the second passive switching mixer, wherein the second passive switching mixer has an enabled and a disabled mode;
    a third passive switching mixer arranged to down-convert the received RF signal with the second LO signal for generating a third down-converted signal at an output port of the second passive switching mixer; and
    a passive output combiner network operatively connected to the output ports of the first passive switching mixer and the second passive switching mixer and arranged to combine the first and the second down-converted signals such that harmonically down-converted signal content present in the first down-converted signal and harmonically down-converted signal content present in the second down-converted signal cancel in a combined output signal of the down-conversion circuit; and wherein the method comprises:

detecting interference based on the first and third down-converted signals; and selectively setting the second passive switching mixer in the enabled mode, for counteracting the interference, or in the disabled mode, for saving power compared with the enabled mode, based on the detection.

\* \* \* \* \*